United States Patent
Schwarzenbach et al.

(10) Patent No.: US 7,098,148 B2
(45) Date of Patent: Aug. 29, 2006

(54) METHOD FOR HEAT TREATING A SEMICONDUCTOR WAFER

(75) Inventors: Walter Schwarzenbach, Saint Nazaire les Eymes (FR); Jean-Marc Waechter, Saint Vincent de Mercuze (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/863,352

(22) Filed: Jun. 9, 2004

(65) Prior Publication Data

US 2004/0259388 A1    Dec. 23, 2004

Related U.S. Application Data

(60) Provisional application No. 60/494,885, filed on Aug. 12, 2003.

(30) Foreign Application Priority Data

Jun. 10, 2003    (FR) .................................. 03 06920

(51) Int. Cl.
*H01L 21/31* (2006.01)
*H01L 21/469* (2006.01)
*H01L 21/30* (2006.01)
*H01L 21/46* (2006.01)
*H01L 21/332* (2006.01)

(52) U.S. Cl. ........................ 438/770; 438/471; 438/455

(58) Field of Classification Search ................ 438/471, 438/406, 455, 795, 765, 766, 404, 770, 595, 438/703; 257/E21.318, E21.568
See application file for complete search history.

(56) References Cited

U.S. PATENT DOCUMENTS

| | | | |
|---|---|---|---|
| 4,804,633 A | 2/1989 | Macelwee et al. | 437/24 |
| 5,741,717 A | 4/1998 | Nakai et al. | 437/24 |
| 5,786,277 A * | 7/1998 | Yamamoto | 438/770 |
| 5,788,763 A | 8/1998 | Hayashi et al. | 117/2 |
| 5,891,265 A | 4/1999 | Nakai et al. | 148/33.3 |
| 6,403,450 B1 * | 6/2002 | Maleville et al. | 438/471 |
| 6,905,333 B1 * | 6/2005 | Cox | 118/725 |

FOREIGN PATENT DOCUMENTS

| | | |
|---|---|---|
| JP | 8045946 | 2/1996 |
| JP | 2003022975 | 1/2003 |

* cited by examiner

*Primary Examiner*—Walter L. Lindsay, Jr.
(74) *Attorney, Agent, or Firm*—Winston & Strawn LLP

(57) ABSTRACT

A method for heat treatment of a semiconductor wafer placed on a support. The method includes subjecting the wafer to a heat treatment with a slow temperature rise from an initial temperature to a treatment ending temperature, and minimizing slip lines that would otherwise result in the wafer from the heat treatment by introducing at least one temperature plateau of constant temperature and of predetermined duration in the heat treatment before reaching the treatment ending temperature. The method reduces the temperature gradients on the wafer to minimize slip lines in the wafer resulting from the heat treatment.

18 Claims, 3 Drawing Sheets

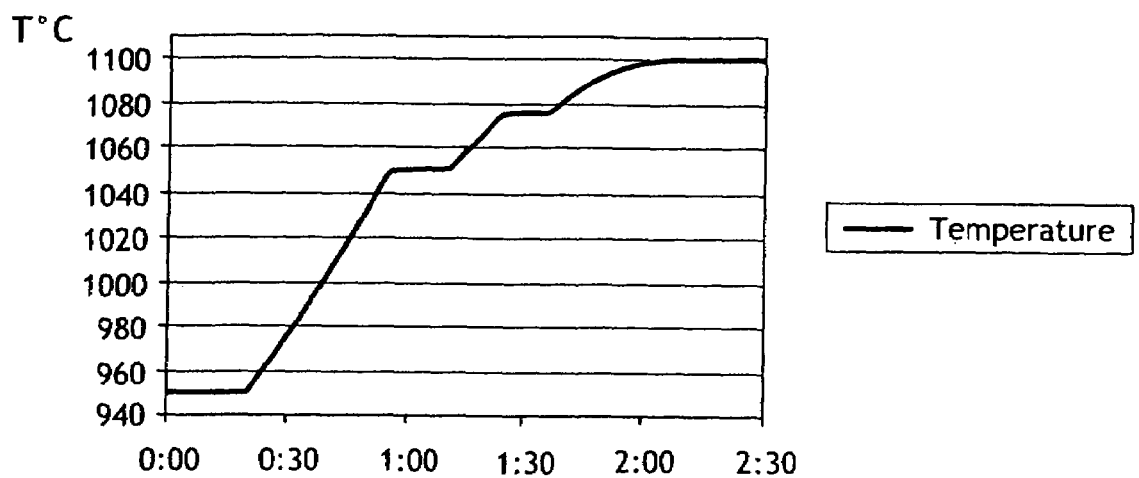
FIG_4
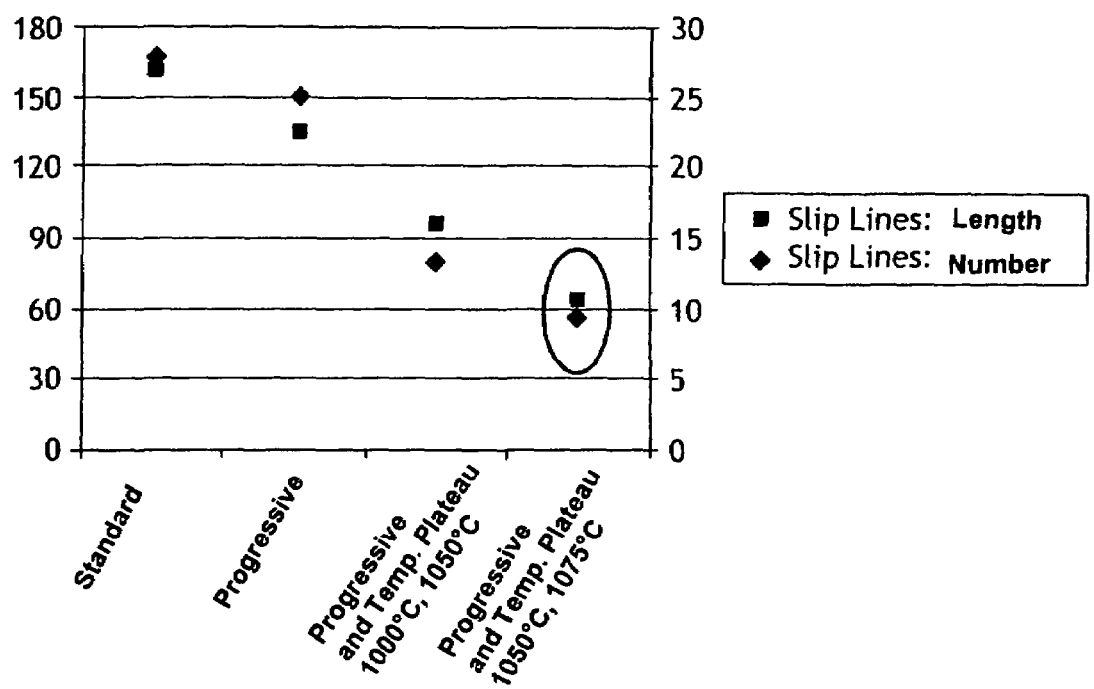
FIG_5

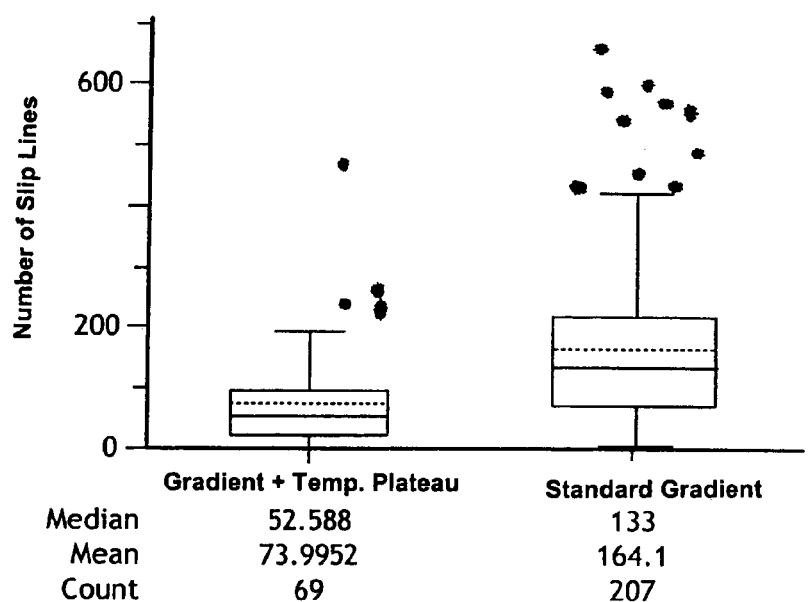
FIG_6
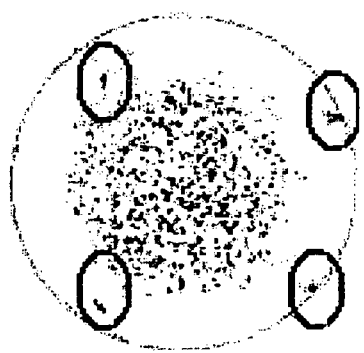
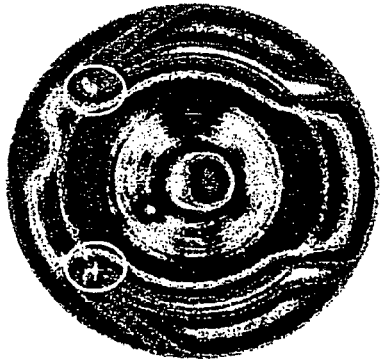
FIG. 7  PRIOR ART         FIG. 8  PRIOR ART

METHOD FOR HEAT TREATING A SEMICONDUCTOR WAFER

This application claims the benefit of U.S. provisional application No. 60/494,885 filed Aug. 12, 2003, the entire content of which is expressly incorporated herein by reference thereto.

BACKGROUND ART

This invention generally relates to heat treating wafers for use in microelectronics, optics and optoelectronics applications. In particular, the invention relates to a high temperature heat treatment process (or annealing) for a semiconductor wafer placed on a support, wherein the process includes a slow rise in temperature up to a treatment ending temperature.

The term "high temperature" annealing means annealing in which at least some phases take place at temperatures exceeding a value on the order of 800° C. Thus, high temperature annealing processes means those that typically take place at temperatures on the order of 800 to 1200° C. These temperatures may be treatment ending temperatures.

In the case of multi-layer wafers, the different layers in the wafer may be assembled together by bonding. The term "bonding" means bringing two surfaces into intimate contact, to create a hydrogen bond or Van der Waals type bond between the two surfaces. This type of bonding may also be denoted as "molecular bonding".

For example, a SMART-CUT® type process could be used to bond layers. This type of process includes a layer transfer, with detachment occurring at a weakened zone that was created by implantation of atomic particles in a donor substrate. The layer to be detached is bonded onto a support before detachment occurs. A general description of the steps of this process can be found in the book entitled "Silicon-On-Insulator technology: Materials to VLSI, $2^{nd}$ edition", by Jean-Pierre Colinge (Kluwer Academic Publishers) at pages 50–51. Thus, it is advantageous to use the SMART-CUT® type process for manufacturing Silicon-On-Insulator (SOI) wafers. Note that other types of processes also include bonding between two wafers.

In general, bringing two wafers into intimate contact is not sufficient for making a strong and permanent bond. Conventionally, a multi-layer wafer is exposed to an additional heat treatment to stabilize the bonding interface between the two wafers. This heat treatment typically increases the temperature of a multi-layer wafer, such as an SOI, to a final temperature on the order of 1100° C. Thus, this is an example of a "high temperature" annealing process.

In particular, when manufacturing an SOI, the heat treatment usually occurs in two phases:

A preliminary phase corresponding to a wafer surface oxidation step. This phase creates an oxide layer that will subsequently be eliminated, and the temperature during this first phase is on the order of 950° C.

A stabilization phase for the bonding interface. During this phase, the temperature is increased to reach a temperature of the order of 1100° C.

During the stabilization phase, the temperature rise occurs along a straight gradient and corresponds to a linear temperature increase. The slope is typically about 5° C. per minute. Such a rise in temperature corresponds to a slow temperature rise. A "slow" temperature rise means an average temperature increase following a general average rate of change of less than 20° C. per minute. A problem related to the second phase (and more generally to stabilization annealing of a multi-layer wafer or even a single wafer) is that the slow temperature rise generates "slip line" type defects. The slip lines may appear anywhere on the surface of the wafer, particularly at the periphery of the wafer and elements supporting the wafer in the annealing oven or furnace. This is illustrated in prior art FIGS. 1–3.

FIGS. 1A and 1B are two different images of slip lines 10 taken by using a scanning electron microscope (SEM) on an SOI. In particular, these defects can be observed from the edge of the SOI.

FIG. 2 illustrates another view of slip lines of an SOI that occurred following a stabilization annealing process. This image was generated by a KLA Tencor SPI® type instrument. In this figure, the slip lines are circled and are distributed such that they remain close to the periphery of the wafer.

FIG. 3 shows another view of an image similar to that of FIG. 2, made on an exposed silicon wafer that was subjected to a high stabilization temperature annealing process of the same type as that applied to the SOI. FIG. 3 also illustrates slip lines (again circled) at the periphery of the wafer. This type of slip line is obviously a disadvantage, and may occur particularly after performing a stabilization anneal of a bonding interface.

In general, slip lines can occur after any high temperature annealing that includes a slow temperature rise up to an end of treatment temperature, applied to a wafer made from one or several semiconductor materials.

SUMMARY OF THE INVENTION

The present invention relates to a method for heat treatment of a semiconductor wafer placed on a support. The method includes subjecting the wafer to a slow temperature rise from an initial wafer temperature to a treatment ending temperature; and minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer.

In an advantageous implementation, the method includes gradually transitioning between each temperature plateau and a subsequent substantially linear temperature rise. The temperature of each temperature plateau is chosen to be closer to the treatment ending temperature than to the initial temperature. The temperature increase advantageously follows an oxidation phase occurring at about 950° C., and the treatment ending temperature may be on the order of 1100° C.

In another advantageous embodiment, the initial wafer temperature is about 950° C. and is achieved as a result of an oxidation phase that is conducted on the wafer prior to the heat treatment. Preferably, at least two temperature plateaus are introduced during the slow temperature rise, with these occurring at about 1050° C. and at about 1075° C., respectively. Typically, each temperature plateau has about a 10 minute duration. In another implementation, the temperature increases asymptotically following a final temperature plateau to the treatment ending temperature.

In an implementation, an initial linear temperature rise has a constant slope on the order of 2 to 5° C. per minute, and the slow temperature rise may include a first temperature plateau. The slow temperature rise may include a second approximately linear temperature rise having a slope on the order of 2 to 5° C. per minute after the first temperature plateau, and the slow temperature rise may include a second temperature plateau after the second temperature rise. Lastly, the slow temperature rise may include a third asymptotic temperature rise to the treatment ending temperature.

In another advantageous embodiment, the invention relates to an improvement in a method for heat treatment of a semiconductor wafer placed on a support, wherein the method includes a slow temperature increase from an initial temperature to a treatment ending temperature. The improvement includes introducing at least one temperature plateau of constant temperature and of a predetermined duration during the temperature increase, to reduce the temperature gradients on the wafer and between the wafer and a support, to thus minimize the occurrence of slip lines on the wafer. This improvement of minimizing slip lines that would otherwise result in the wafer from the heat treatment is achieved due to the reduction of temperature gradients on the wafer.

The present invention is advantageously generally applicable to different types of high temperature annealing processes including those that include a slow temperature rise up to the treatment ending temperature. This invention thus does not apply to RTA (Rapid Thermal Annealing) type heat treatments that use extremely fast temperature increases. Furthermore, the invention is advantageously applicable to single layer wafers or multi-layer wafers (for example SOI—Silicon On Insulator) wafers. It should also be understood that, although the particular examples described in the text apply to SOI (Silicon On Insulator) type wafers, and bulk silicon wafers, the invention also relates to other semiconductor material wafers.

BRIEF DESCRIPTION OF THE DRAWINGS

Other aspects, purposes and advantages of the invention will become clear after reading the following description with reference to the attached drawings, in which:

FIG. 4 is a graph illustrating a temperature rise during a process according to the invention;

FIGS. 5 and 6 are graphs illustrating the reduction in slip lines on a silicon wafer and on an SOI wafer, respectively, in an implementation of the invention; and FIGS. 7 and 8 illustrate slip lines generated by a heat treatment having a uniform slope and applied for a longer duration than that of a conventional heat treatment.

DETAILED DESCRIPTION OF THE PREFERRED EMBODIMENTS

Figure 1:
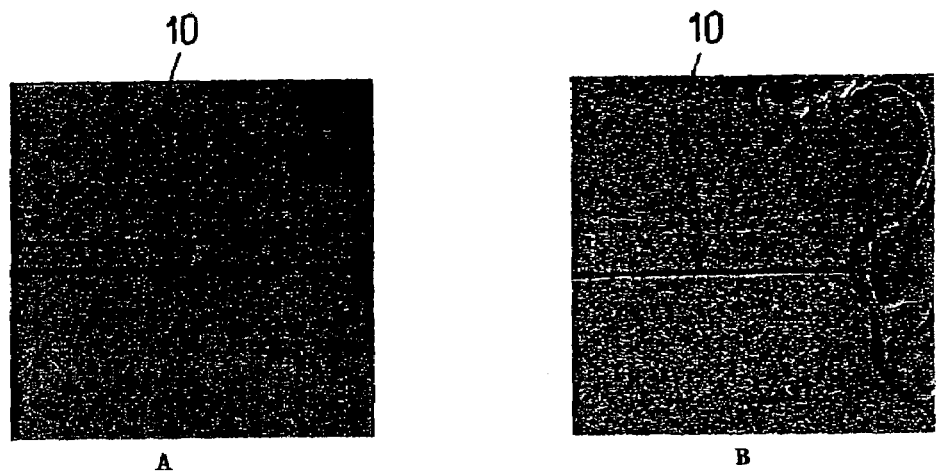
FIGS. 1A and 1B are images from a scanning electron microscope that illustrate two different views of slip lines.
Figure 2:
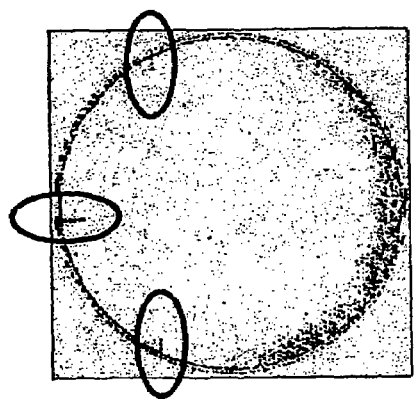
FIG. 2 is an image from a scanning electron microscope of slip lines formed after a stabilizing annealing process.
Figure 3:
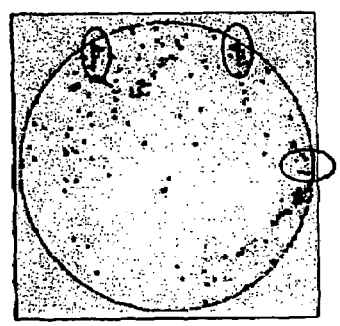
FIG. 3 is an image similar to that of FIG. 2 of slip lines formed after a high temperature stabilizing annealing process.

It should be understood that, in general, the present method pertains to a heat treatment process applied to a wafer produced from one or several semiconductor materials and arranged on a support.

FIG. 4 is a graph illustrating a temperature rise corresponding to an embodiment of the invention. The ordinate shows the temperature difference (in ° C.) as a function of time (which is indicated in hours and minutes). FIG. 4 shows that a temperature plateau at a temperature on the order of 950° C. was maintained before the temperature rise. This may correspond to a preliminary oxidation phase, like that mentioned above.

The invention may be applied to a multi-layer wafer, for stabilization annealing of a bonding interface, after a first heat treatment phase at a temperature on the order of 950° C. conducted to oxidize the wafer. However, it should be noted that the method can in general be used for the purposes of any type of high temperature annealing, including a slow temperature rise up to a treatment ending temperature.

The temperature rise illustrated in FIG. 4 includes further elements. In particular, after the temperature plateau at 950° C., which corresponds to an initial oxidization phase, the following occurs:

a linear initial rise with a constant slope of the order of 3° C. per minute. Note that, in general, this slope may be on the order of about 2 to 5° C. per minute, a first temperature plateau, a second approximately linear temperature rise with a constant slope approximately equivalent to the slope of the initial rise, a second temperature plateau, and a third temperature rise that reaches the treatment ending temperature at 1100° C.

Note that if the initial rise and the second rise are described as being "linear" or "approximately linear", there will preferably be a gradual transition between these temperature rises and the temperature plateaus. This situation is different for prior art annealing processes wherein such transitions usually occur with a very clearly defined change in the slope of the temperature rise. The applicant has determined that the use of such "slow" or gradual transitions further improves the results.

It should also be noted that the third temperature rise of this example is not linear, and that its slope progressively decreases to become "asymptotic" when nearing the treatment ending temperature. The term "asymptotic" means herein that, unlike a genuine asymptote, the temperature progressively gets closer to and then finally reaches a final value (the treatment ending temperature), but does so with a continuously decreasing slope.

In an embodiment, each of the two temperature plateaus lasts for about 10 minutes. A "temperature plateau" means a step in which the temperature is held at an approximately constant value for a given time. The duration of the temperature plateaus (the value of approximately 10 minutes mentioned above is not limiting) must be sufficiently long so that temperature gradients on the wafer (and between the wafer and its support in the annealing device) can be equalized, and then cancel out wherever possible. Therefore, the duration of the temperature plateau may vary depending on the value of the temperature rise gradients and the temperature difference between temperature plateaus. Thus, the duration of each temperature plateau may be shorter if the difference between each temperature is smaller. Consequently, the number of temperature plateaus for a particular temperature rise can be increased by reducing the duration of each temperature plateau. Conversely, the method can be implemented by using a single temperature plateau.

Therefore, returning to the particular example of the temperature rise illustrated in FIG. 4, two temperature plateaus occur at temperatures of about 1050° C. and 1075° C., respectively. The plateaus can be set to occur at different temperatures, for example 1000° C. and 1050° C., respectively, but the results would not be as good, as will be explained below.

The temperature plateaus (or the temperature plateau if there is only one) are thus preferably located near the top portion of a temperature interval, near the treatment ending temperature. For example, in a temperature rise from 950° C. to 1100° C., the temperature plateaus will preferably be at more than 1050° C. Adding at least one temperature plateau to the temperature rise curve for a stabilization heat treatment reduces thermal and/or mechanical stresses applied to the wafer being treated.

Slip lines are due to thermal stresses. The slip lines form because different parts of the wafer are not necessarily all at the same temperature at the same time, although the different parts are all heated in the same oven or furnace. Slip lines can also be caused by mechanical stresses. These stresses can result from physical contacts between the wafer and the mechanical elements supporting the wafer in the oven. The mechanical element is typically a pod (typically made of SiC) that supports the wafer.

In order to enable relaxation of these stresses and prevent the formation of slip lines in a wafer, it may be possible to control the temperature rise from 950° C. to 1100° C. by using a single low slope (very much lower than the conventional value of 5° C. per minute). But this solution is not economically feasible, since it would excessively slow down the stabilization process. Furthermore, such a continuous linear temperature rise may still cause slip lines due to temperature differences created on the wafer. The present process provides a solution that significantly reduces the number of slip lines and is economically feasible.

FIG. 5 shows the results obtained in terms of length and number of slip lines for different temperature rise conditions between 950 and 1100° C. FIG. 5 displays:
on the abscissa, four temperature rise conditions:
a "standard" rise, carried out according to the prior art using a single linear slope of 5° C. per minute,
a "progressive" rise, consisting of a linear initial rise as in the prior art, followed by an asymptotic increase to approach the temperature of 1100° C.,
a "progressive rise with temperature plateaus", the two temperature plateaus occurring at 1000° C. and 1050° C.,
a "progressive rise with temperature plateaus" as illustrated in FIG. 4.
on the ordinate, the average length of the slip lines (left scale) and the observed number of slip lines (right scale).

FIG. 5 thus illustrates that a significant reduction both in the number and the average length of the slip lines occurs when using the "progressive rise with temperature plateaus" methods. It is noted that the different temperature increases shown in FIG. 5 were made on identical bulk silicon wafers, and that the slip lines were measured under the same conditions with the single KLA Tencor SP DLS type equipment, measurements made in Normal, Low Throughput mode, and thresholds 014/014 on bulk wafer.

It is also noted that the rise illustrated in FIG. 4 produces particularly interesting results: a reduction in the number of slip lines from 28 to 10, and a reduction in the average length from 170 to 60 mm. Thus, these results show that use of the temperature increases of FIG. 4 reduces the slip lines generated by a stabilization heat treatment by a factor on the order of 2.5 to 3.

Similarly, FIG. 6 illustrates the results obtained in terms of the length of slip lines on identical SOI wafers after a stabilization heat treatment, occurring with:
a temperature increase according to FIG. 4 (left part of the graph), or
a "standard" temperature increase, with a single linear slope on the order of 5° C. per minute (right part of the graph).

Once again, the present method very significantly reduces the number of slip lines generated by a stabilization heat treatment (reduction from 207 to 69 slip lines for SOIs that are otherwise identical).

It should be noted that the present method can be used in a particularly simple manner, in which the temperature increase includes only a single temperature plateau. It should also be noted that the particular temperature values given above to illustrate an embodiment are not limiting. The method is thus applicable in general to any high temperature annealing that includes a slow temperature increase up to a treatment ending temperature.

It is also noted that adding at least one temperature plateau as the temperature increases obviously gives better results in terms of reducing the number and length of slip lines than the use of a linear gradient without any temperature plateau for the same starting and ending temperature values. This is achieved with only a slightly longer total temperature increase duration. In this respect, tests were conducted using identical wafers and applying a linear temperature rise at a constant slope, using the same total time for the temperature increase as that for the temperature increase in FIG. 4.

Use of the present method slightly increases the stabilization heat treatment time, as compared with conventional stabilization annealing treatments. However, the duration of the final high temperature plateau that occurs at the treatment ending temperature can be reduced because the use of temperature plateaus extends the duration of the global temperature increase. Consequently, the wafer was exposed to a thermal budget greater than the budget that it would have received during a conventional linear temperature rise.

The tests demonstrate that a reduction in the number and length of slip lines is not greater in the case of a temperature increase at constant slope completed within the same global time. Conversely, such a temperature increase at a constant slope produces more slip lines in wafers than the present process, as shown in FIGS. 7 and 8.

In FIG. 7, the circled slip lines typically correspond to the ends of the fingers of the mechanical element that supports and holds the wafer in place in the heat treatment furnace. These types of defects are located inside the active face of the wafer, and render the wafer absolutely unusable for microelectronics purposes. It is therefore clear that the solution consisting of introducing at least one temperature plateau (for the same global temperature rise time) is highly advantageous.

What is claimed is:

1. A method for heat treatment of a semiconductor wafer placed on a support which comprises:
conducting an oxidation phase on the wafer prior to heat the wafer to an initial wafer temperature;
subjecting the wafer to a high temperature anneal that includes a low temperature rise from the initial wafer temperature to a treatment ending temperature; and
minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer;
wherein the duration of the temperature plateau, or the combined duration of the temperature plateaus, is chosen to equalize and minimize temperature gradients between the wafer and its support.

2. The method of claim 1 wherein the initial wafer temperature is about 950° C.

3. The method of claim 1 which further comprises gradually transitioning between the temperature of the temperature plateau and a subsequent substantially linear temperature rise.

4. A method for heat treatment of a semiconductor wafer placed on a support which comprises:
    subjecting the wafer to a slow temperature rise from an initial wafer temperature to a treatment ending temperature; and
    minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer;
    wherein the temperature of each temperature plateau is chosen to be closer to the treatment ending temperature than to the initial wafer temperature.

5. The method of claim 1 wherein the wafer is a multilayer wafer that includes at least two layers bonded together at a bonding interface, and wherein the heat treatment also stabilizes the bond at the bonding interface.

6. The method of claim 1 wherein the treatment ending temperature is on the order of 1100° C.

7. The method claim 1 wherein the wafer has a Silicon On Insulator (SOI) structure.

8. A method for heat treatment of a semiconductor wafer placed on a support which comprises:
    subjecting the wafer to a slow temperature rise from an initial wafer temperature to a treatment ending temperature; and
    minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer;
    wherein at least two temperature plateaus are introduced during the slow temperature rise.

9. The method of claim 8 wherein the two temperature plateaus occur at about 1050° C. and at about 1075° C., respectively.

10. The method of claim 9 wherein each temperature plateau has about a 10 minute duration.

11. The method of claim 1 wherein the temperature increases asymptotically following a final temperature plateau to the treatment ending temperature.

12. A method for heat treatment of a semiconductor wafer placed on a support which comprises:
    subjecting the wafer to a slow temperature rise from an initial wafer temperature to a treatment ending temperature, including an initial linear temperature rise having a constant slope on the order of 2 to 5° C. per minute and
    minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer.

13. The method of claim 12 wherein the slow temperature rise includes a first temperature plateau.

14. The method of claim 13 wherein the slow temperature rise includes a second approximately linear temperature rise having a slope on the order of 2 to 5° C. per minute after the first temperature plateau.

15. The method of claim 14 wherein the slow temperature rise includes a second temperature plateau after the second temperature rise.

16. The method of claim 15 wherein the slow temperature rise includes a third asymptotic temperature rise to the treatment ending temperature.

17. In a method for conducting a high temperature anneal heat treatment of a semiconductor wafer placed on a support, the process including conducting an oxidation phase on the wafer prior to heat the wafer to an initial wafer temperature; conducting a slow temperature increase from the initial wafer temperature to a treatment ending temperature, the improvement which comprises minimizing slip lines that would otherwise result in the wafer from the heat treatment by introducing at least one temperature plateau of constant temperature and of predetermined duration in the heat treatment before reaching the treatment ending temperature in order to reduce temperature gradients on the wafer to thus minimize the occurrence of slip lines in the wafer; wherein the duration of the temperature plateau, or the combined duration of the temperature plateaus, is chosen to equalize and minimize temperature gradients between the wafer and its support.

18. The method of claim 17 wherein the initial wafer temperature is about 950° C.

* * * * *